United States Patent [19]
Inushima et al.

[11] Patent Number: 5,855,970
[45] Date of Patent: Jan. 5, 1999

[54] METHOD OF FORMING A FILM ON A SUBSTRATE

[75] Inventors: Takashi Inushima; Shigenori Hayashi; Toru Takayama, all of Kanagawa; Masakazu Odaka, Akita; Naoki Hirose, Yamaguchi, all of Japan

[73] Assignee: Semiconductor Energy Laboratory Co., Ltd., Kanagawa, Japan

[21] Appl. No.: 769,115

[22] Filed: Dec. 18, 1996

Related U.S. Application Data

[62] Division of Ser. No. 376,736, Jan. 23, 1995, Pat. No. 5,629,245, which is a division of Ser. No. 971,242, Sep. 8, 1992, Pat. No. 5,427,824, which is a continuation of Ser. No. 702,492, May 20, 1991, abandoned, which is a continuation-in-part of Ser. No. 497,794, Mar. 22, 1990, abandoned, which is a continuation of Ser. No. 091,770, Sep. 1, 1987, abandoned.

[30] Foreign Application Priority Data

| Sep. 9, 1986 | [JP] | Japan | 61-213323 |
| Sep. 9, 1986 | [JP] | Japan | 61-213324 |
| Sep. 9, 1986 | [JP] | Japan | 61-213325 |
| May 6, 1987 | [JP] | Japan | 61-141050 |

[51] Int. Cl.$^6$ .................................................. H05H 1/24
[52] U.S. Cl. .................... 427/579; 427/123; 427/255.3; 427/264; 427/265; 427/270; 427/271; 427/307; 427/404; 427/419.2; 427/585
[58] Field of Search .................................. 427/579, 585, 427/307, 255.3, 123, 264, 265, 270, 271, 404, 419.2

[56] References Cited

U.S. PATENT DOCUMENTS

| 3,026,435 | 3/1962 | McPherson | 313/22 |
| 3,228,812 | 1/1966 | Blake | 427/93 X |
| 3,372,672 | 3/1968 | Wright | 427/54.1 |
| 3,485,666 | 12/1969 | Sterling et al. | 427/37 |
| 3,619,682 | 11/1971 | Lo | 313/22 |
| 3,661,637 | 5/1972 | Sirtl | 427/54.1 |
| 3,665,235 | 5/1972 | Hugot | 313/24 |
| 3,934,060 | 1/1976 | Burt et al. | 427/95 |

(List continued on next page.)

FOREIGN PATENT DOCUMENTS

| 51-21753 | 7/1976 | Japan . |
| 52-065575 | 5/1977 | Japan . |
| 59-087834 | 5/1984 | Japan . |
| 59-82732 | 5/1984 | Japan . |
| 59-104120 | 6/1984 | Japan . |
| 59-194452 | 11/1984 | Japan . |

(List continued on next page.)

OTHER PUBLICATIONS

Japanese Journal of Applied Physics, vol. 23, No. 10, Oct. 1984, Kamisako et al.: Analysis of Deposition Rate Distribution in the Photo–CVD of a–Si By A Unified Reactor With A Lamp, pp. L776–L778.

"Silicon Processing For The VLSI Era", vol. 2—Process Integration—Wolf; Wolf Lattice Press; Sunset Beach, Ca.© 1990 (No month avail.).

Planarized Deposition of High–Quality Silicon Dioxide Film by Photo–Assisted Plasma CVD at 300 degree C. using Tetractryl Orthosilicate; Suzuki et al. Japanese Journal of Applied Physics, Part 2, 29(12); 1990; pp. 2341–2344 (no month avail.).

(List continued on next page.)

*Primary Examiner*—Bernard Pianalto
*Attorney, Agent, or Firm*—Sixbey, Friedman, Leedom & Ferguson, P.C.; Gerald J. Ferguson, Jr.; Jeffrey L. Costellia

[57] ABSTRACT

An improved CVD apparatus for depositing a uniform film is shown. The apparatus comprises a reaction chamber, a substrate holder and a plurality of light sources for photo CVD or a pair of electrodes for plasma CVD. The substrate holder is a cylindrical cart which is encircled by the light sources, and which is rotated around its axis by a driving device. With this configuration, the substrates mounted on the cart and the surroundings can be energized by light of plasma evenly throughout the surfaces to be coated.

23 Claims, 8 Drawing Sheets

U.S. PATENT DOCUMENTS

| | | | |
|---|---|---|---|
| 4,137,365 | 1/1979 | Wydeven et al. | 428/412 |
| 4,282,268 | 8/1981 | Priestley et al. | 427/579 |
| 4,323,810 | 4/1982 | Horstmann | 313/24 |
| 4,330,570 | 5/1982 | Giuliani et al. | 427/64 |
| 4,365,107 | 12/1982 | Yamauchi | 427/39 |
| 4,371,587 | 2/1983 | Peters | 428/446 |
| 4,402,997 | 9/1983 | Hogan et al. | 118/71.5 |
| 4,419,385 | 12/1983 | Peters | 427/99 |
| 4,435,445 | 3/1984 | Allred et al. | 427/54.1 |
| 4,435,476 | 3/1984 | Phillips et al. | 428/412 |
| 4,451,503 | 5/1984 | Blum et al. | 427/53.1 |
| 4,496,609 | 1/1985 | McNeilly | 427/55 |
| 4,496,828 | 1/1985 | Kusmierz | 118/730 |
| 4,503,126 | 3/1985 | Phillips et al. | 428/412 |
| 4,509,451 | 4/1985 | Collins et al. | 427/39 |
| 4,529,474 | 7/1985 | Fujiyama et al. | 134/1 X |
| 4,529,475 | 7/1985 | Okano et al. | 156/643 |
| 4,532,022 | 7/1985 | Takashi et al. | |
| 4,532,196 | 7/1985 | Yasui et al. | |
| 4,539,068 | 9/1985 | Takuqi et al. | 427/39 |
| 4,544,423 | 10/1985 | Tsuge et al. | 427/74 |
| 4,558,660 | 12/1985 | Nishizawa | 118/715 |
| 4,567,352 | 1/1986 | Mimura et al. | 219/405 |
| 4,568,565 | 2/1986 | Gupta et al. | 427/255.2 |
| 4,576,698 | 3/1986 | Gallagher et al. | 134/1 X |
| 4,581,100 | 4/1986 | Hatzakis et al. | 156/643 |
| 4,601,781 | 7/1986 | Mercier et al. | 156/643 |
| 4,608,117 | 8/1986 | Ehrlich et al. | 427/53.1 |
| 4,612,207 | 9/1986 | Jansen | 118/715 |
| 4,615,294 | 10/1986 | Scapple | 118/725 |
| 4,633,809 | 1/1987 | Hirose | 118/719 |
| 4,649,071 | 3/1987 | Tajima et al. | 428/212 |
| 4,654,226 | 3/1987 | Jackson et al. | 427/54.1 |
| 4,676,195 | 6/1987 | Yasi | 118/723 |
| 4,681,653 | 7/1987 | Purdes et al. | 427/39 |
| 4,695,331 | 9/1987 | Romaprasud | 427/54.1 |
| 4,699,805 | 10/1987 | Seelbach et al. | 118/71.5 |
| 4,702,936 | 10/1987 | Maeda et al. | 427/54.1 |
| 4,709,655 | 12/1987 | Van Mastright | 118/723 |
| 4,713,258 | 12/1987 | Umemura | 427/35 |
| 4,717,596 | 1/1988 | Barber et al. | 427/248.1 |
| 4,719,123 | 1/1988 | Haku et al. | 427/53.1 |
| 4,726,963 | 2/1988 | Ishihara et al. | 427/53.1 |
| 4,728,528 | 3/1988 | Ishihara et al. | 427/53.1 |
| 4,753,818 | 6/1988 | Rogers, Jr. | 427/54.1 |
| 4,759,947 | 7/1988 | Ishihara et al. | 427/53.1 |
| 4,786,352 | 11/1988 | Benzing | 156/643 |
| 4,795,880 | 1/1989 | Hayes et al. | 219/121.52 |
| 4,811,684 | 3/1989 | Tashiro et al. | 427/53.1 |
| 4,872,947 | 10/1989 | Wang et al. | 156/643 |
| 4,892,753 | 1/1990 | Wang et al. | 427/579 |
| 4,950,624 | 8/1990 | Inuzima et al. | 437/235 |
| 5,000,113 | 3/1991 | Wang et al. | 118/723 |
| 5,354,715 | 10/1994 | Wang et al. | 438/699 |
| 5,362,526 | 11/1994 | Wang et al. | 427/573 |
| 5,424,131 | 6/1995 | Wertheimer et al. | 428/413 |
| 5,427,824 | 6/1995 | Inushima et al. | 427/493 |
| 5,607,880 | 3/1997 | Suzuki et al. | 437/195 |

FOREIGN PATENT DOCUMENTS

| | | |
|---|---|---|
| 60-245217 | 5/1985 | Japan . |
| 60-167318 | 8/1985 | Japan . |
| 61-063020 | 4/1986 | Japan . |
| 61-65419 | 4/1986 | Japan . |
| 61-103539 | 5/1986 | Japan . |
| 61-210622 | 9/1986 | Japan . |
| 61-228633 | 10/1986 | Japan . |
| 61-234531 | 10/1986 | Japan . |
| 62-054940 | 3/1987 | Japan . |
| 62-80272 | 4/1987 | Japan ... 118/725 |
| 62-160462 | 7/1987 | Japan ... 118/725 |
| 62-188375 | 8/1987 | Japan . |
| 63-147314 | 6/1988 | Japan . |
| 63-246829 | 10/1988 | Japan . |
| 64-28925 | 1/1989 | Japan . |
| 02-219232 | 8/1990 | Japan . |
| 2-219232 | 8/1990 | Japan . |
| 182797 | 9/1966 | U.S.S.R. . |

OTHER PUBLICATIONS

"Modeling of the Plasmochemical Synthesis of Silicon Dioxide"; Inanov et al.; 1985 (No month avail.).

Properties of Silicon Dioxide Films Prepared From Tetralthoxysilane From Gas and Liquid Phases (No date avail.).

"VLSI Fabrication Principles"; Ghandi; ©1983; John Wiley & Sona; NY, NY, pp. 422–424 (No month avail.).

Wang et al., "The Key is Decomposition of TEOS at Low Temperature by Using Ozone" (in Japanese with partial English translation) (No date avail.).

Wolf, Stanley, "Si Proc. for the VSLI ERA", vol. 1, (1986) pp. 182–187 (No month avail.).

"Planar Tech. For Sub. Micron Device... Complex Proc" Semiconductor News, 1989 (No month avail.).

"Nikkei Microdevices", No. 26, Aug. 1987, pp. 125–136 (Full Transaction).

van de Van, "Plasma Deposition of Silicon Dioxide and Silicon Nitride Films", Solid State Technology, vol. 23, No. 11, Apr. 1981, pp. 167–171.

Pande et al., "A Novel Low–Temperature Method of $Si_2$ Film Deposition for MOSFET Applications", Journal of Electronic Materials, Cvol. 13, No. 3, 1984, pp. 593–602 (No month avail.).

Wang et al., "Fast Deposition of a Leveled $SiO_2$ Even on Al Wirings Having 0.6$\mu$m Gaps", Nikkei Microdevices, vol. 8, No. 26, Aug. 1987, pp. 125–133.

Nikkei Microdevices, No. 25, Jul. 1987, pp. 132–137.

Levin et al., "The Step Coverage of Undoped and Phosphorus–Doped $SiO_2$ glass films", J. Vac. Sci. Technol. B, vol. 1, No. 1, Jan.–Mar. 1983, pp. 54–61.

Amick, "Deposition Techniques for Dielectric Films on Semiconductor Devices", J. Vac. Sci. Technol., vol. 14, No. 5, Sep./Oct. 1977, pp. 1053–1063.

Priestley et al, "Deposition and Characterization of Thin $SiO_x$ Films", Thin Solid Films, vol. 69, 1980, pp. 39–43 (No month avail.).

Okabayashi, "Surface Planaraization Technique in Integrated Circuits", Ohyo Butsuri, vol. 7, No. 54, 1985, pp. 39–43 (No month available).

2

METHOD OF FORMING A FILM ON A SUBSTRATE

This is a Divisional application of Ser. No. 08/376,736 filed Jan. 23, 1995, U.S. Pat. No. 5,629,245, which itself is a division of Ser. No. 07/971,242 filed Sep. 8, 1992, U.S. Pat. No. 5,427,824, which is a continuation of Ser. No. 07/702,492 filed May 20, 1991, abandoned; which is a continuation-in-part of Ser. No. 07/497,794 filed Mar. 22, 1990, abandoned; which is a continuation of Ser. No. 07/091,770 filed Sep. 1, 1987, abandoned.

BACKGROUND OF THE INVENTION

The invention relates to a photo enhanced CVD apparatus.

Many chemical vapor deposition (CVD) processes are used, such as APCVD, LP CVD, plasma CVD, thermal CVD and so forth, for depositing a film on a substrate. While these processes have their own peculiar characteristics respectively, the temperature at which each process is carried out is commonly rather high. Such high temperature process is not suitable for formation of passivation film on an aluminum electrode arrangement.

Photo enhanced CVD process has attracted the interest of artisans because it can be carried out at a comparatively low temperature. This process is based on the energy of light, namely an optical reaction is carried out. For example, in the case of photo CVD process using silane and ammonia, mercury atoms are excited by irradiation of ultraviolet light of 2,537 Å in wavelength. The process is carried out to deposit a silicon nitride film on a substrate in accordance with the following equation:

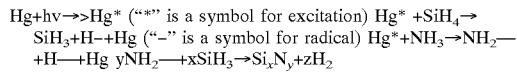

In the above equations, x, y and z are chosen appropriately.

FIG. 1 is a cross-section view showing a photo CVD apparatus which has been devised by the inventors in advance of the present invention. To facilitate the understanding of the background of the present invention, this apparatus will be briefly explained. In the figure, the apparatus comprises a reaction chamber 31, light source chambers 39 and ultraviolet light sources 41. Between the light source chambers 39, a cart 35 is mounted so as to be capable of moving in the direction perpendicular to the drawing sheet. The cart is provided with heaters 37 to heat substrates mounted on the external surfaces of the cart 35 facing to the light source chambers 39. The temperature of the substrates 33 is elevated to about 200° C. which is suitable for forming a silicon nitride film. In the reaction chamber 31 is circulated a process gas at a pressure of several Torrs. The process gas is irradiated through quartz windows 47 with light radiated from the light source 41. A numeral 45 designates electrodes by virtue of which discharge takes place with the cart as the other electrode and undesired product deposited on the surface of the quartz windows 47 can be eliminated by sputtering.

However, with this apparatus, the thickness of deposited film depends on th spatial relationship between the light sources and the position of the substrates. Namely, the product of the CVD process may be deposited with a greater thickness at the position irradiated with stronger light. Generally speaking, the tolerable fluctuation of the thickness of the film is about 10. Furthermore, the quartz windows 47 have to be thick to bear the differential pressure between the inside of the reaction chamber 31 and the light source chamber 39 in which cooling gas is circulated. The differential pressure may cause leakage of the cooling gas from the light source chamber 39 into the reaction chamber 31. As an alternative, a particular cooling system may be provided for the light source chamber so the pressure in the light source chamber, and therefore the differential pressure, can be decreased. Also, when discharge between the cart 35 and the reaction chamber 31 is desired to remove unnecessary film deposited on the light window by sputtering, the discharge tends to deviate from the window. Because of this, the particular electrodes 45 have to be provided which makes the size of the apparatus large.

As to unevenness of film deposited by CVD, it is also the problem in the case of plasma CVD. The energy of plasma seems dependent on the relationship between the substrate and a pair of electrodes for discharge. So a uniform deposition condition on a substrate to be coated is also demanded for plasma CVD.

SUMMARY OF THE INVENTION

It is therefore an object of the invention to provide an CVD apparatus with which a film can be deposited with a uniform thickness.

It is another object of the invention to provide a CVD apparatus with which a film can be deposited with high quality.

It is a further object of the invention to provide a cheaper CVD apparatus.

It is still a further object of the invention to provide a compact CVD apparatus.

DETAILED DESCRIPTION OF THE PREFERRED EMBODIMENT

Figure 1:
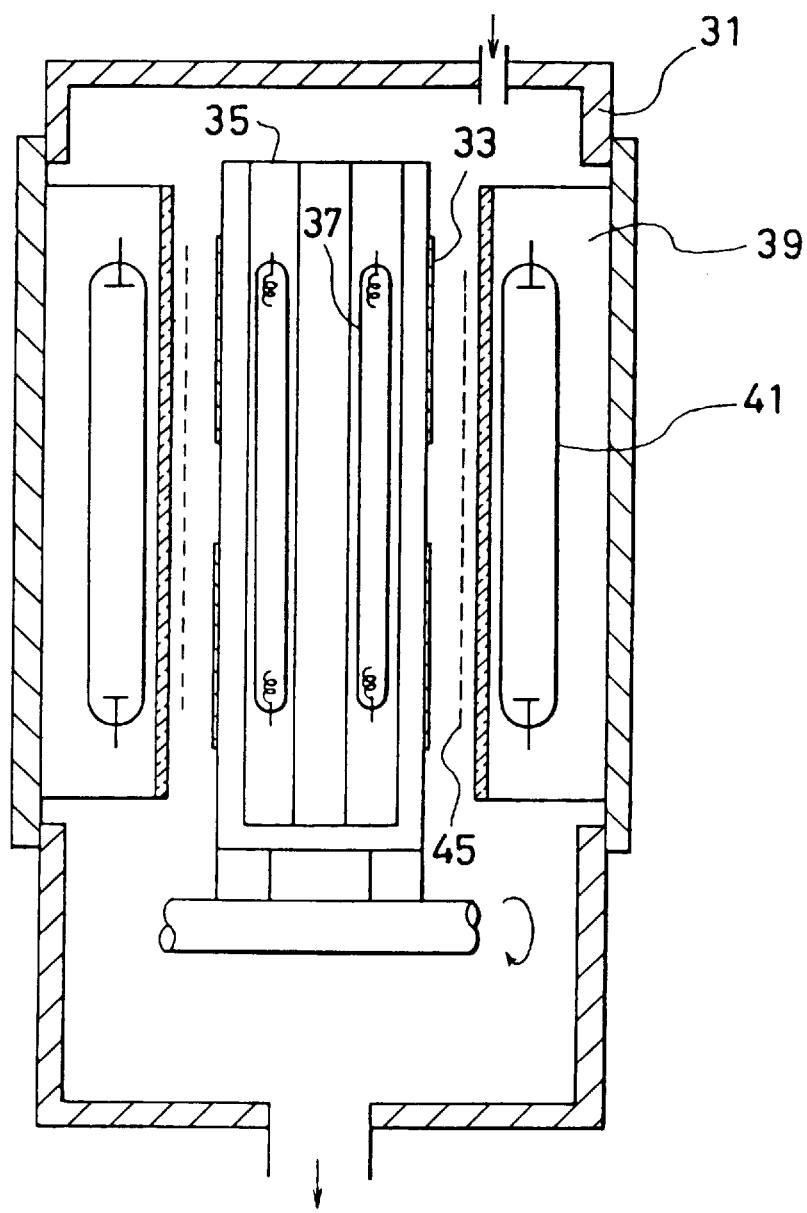
FIG. 1 is a cross-section view of an example of a photo CVD apparatus.
Figure 2:
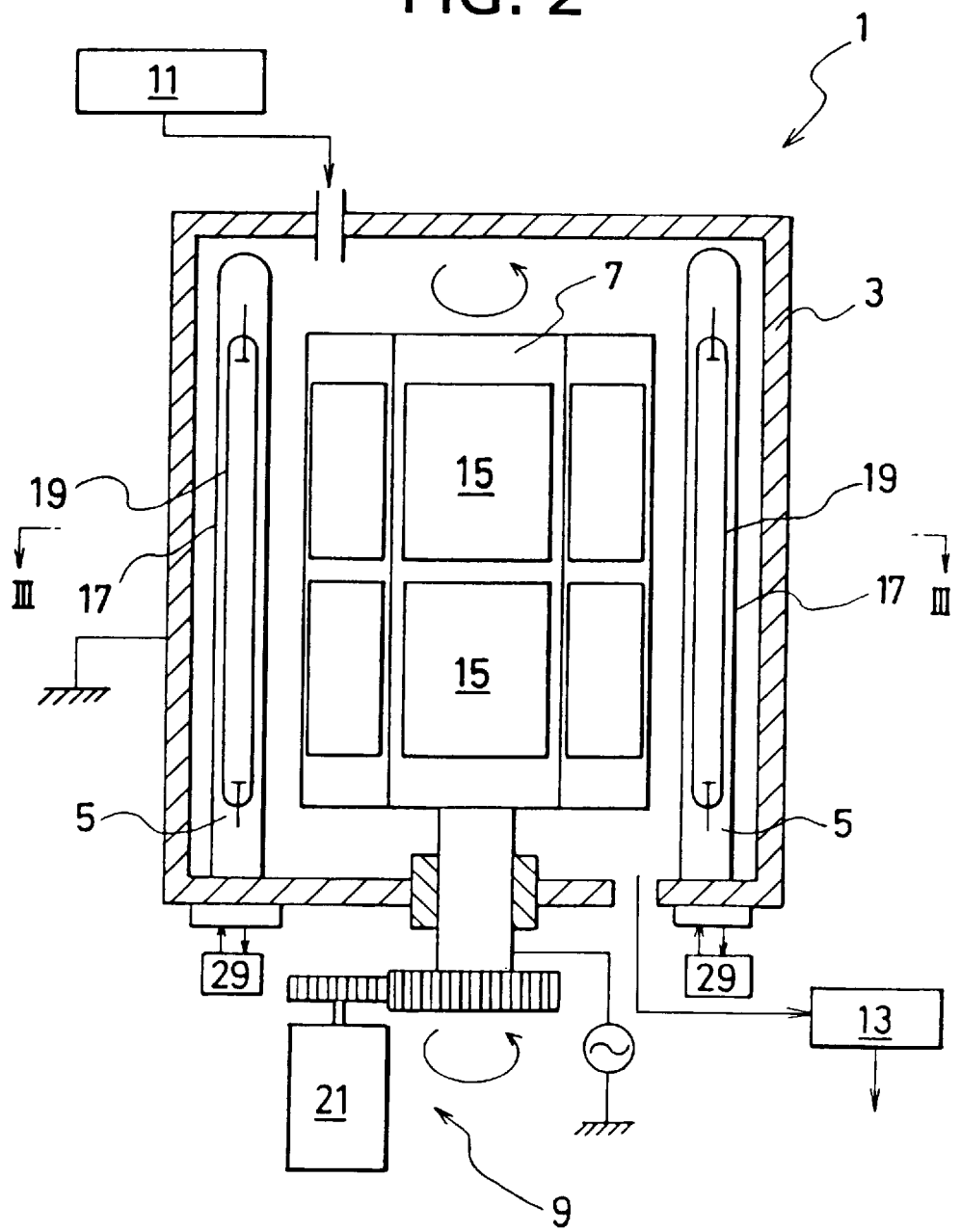
FIG. 2 is a cross-section view showing an embodiment of the invention.
Figure 3:
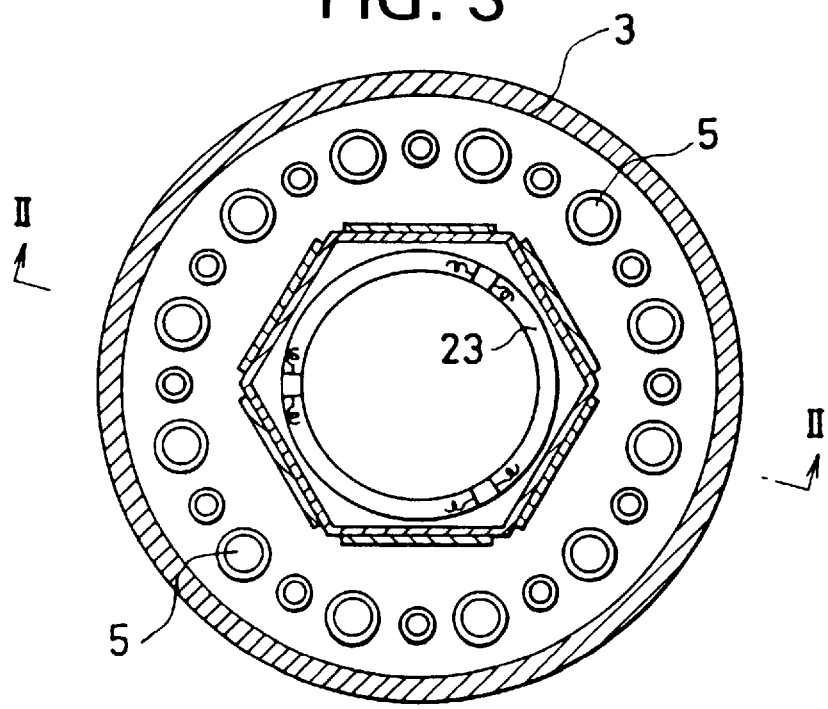
FIG. 3 is a cross-section view taken along a III—III line of FIG. 2.

Referring to FIG. 2 and FIG. 3, a photo enhanced CVD apparatus in accordance with the invention is illustrated. In the figure, the apparatus 1 comprises a reaction chamber 3, a hexagonal cart as a substrate holder having six lateral faces on which substrates 15 are mounted, a driving device 9 with a motor 21 for rotating the cart 7 around its axis, a plurality of quartz tubes 17, which may be alternatingly provided of different diameters, on the inside of the reaction chamber 3, with one end of each tube at a constant angular distance around the cart 7 and with the other end of each tube being closed, mercury lamps 19 provided in and housed air-tightly by the quartz tube respectively, halogen lamp heaters 23 arranged along the axial direction, a process gas introduction system 11, and an exhaustion system 13. A cooling gas, such as nitrogen gas, is circulated in the quartz tubes 17 by means of recirculation means 29. On each face of the cart 7, two substrates each 35 cm long and 30 cm wide can be mounted, and therefore the cart 7 can hold twelve substrates thereon. The cart is preferentially removable from the driving device so that substrates can be mounted outside the reaction chamber 3.

Next, the process in the apparatus will be explained. First, twelve substrates are mounted on the cart 7 and entered into the reaction chamber 3. After evacuating the reaction chamber 3 to $10^{-2}$–$10^{-6}$ Torr by means of the exhaustion system 13, a process gas is inputted from the introduction system 11 at about 3 Torr. Simultaneously, the substrates 15 are heated by the heater 23 to about 200° C. Then, the cart 7 encircled by the mercury lamps 19 is rotated at 2 rpm by the driving device 9 and irradiated with ultraviolet light from the lamps 19, whereupon the product of a reaction initiated by optical energy is deposited on the substrates 15. The product undesirably deposited on the quartz tubes 17 can be removed by sputtering in virtue of discharge between the cart 7 and the reaction chamber 3. Photo enhanced CVD process is carried out, e.g., in accordance with the following equation:

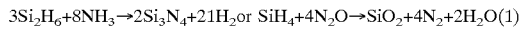
$$3Si_2H_6+8NH_3 \rightarrow 2Si_3N_4+21H_2 \text{ or } SiH_4+4N_2O \rightarrow SiO_2+4N_2+2H_2O \quad (1)$$

Figure 4:
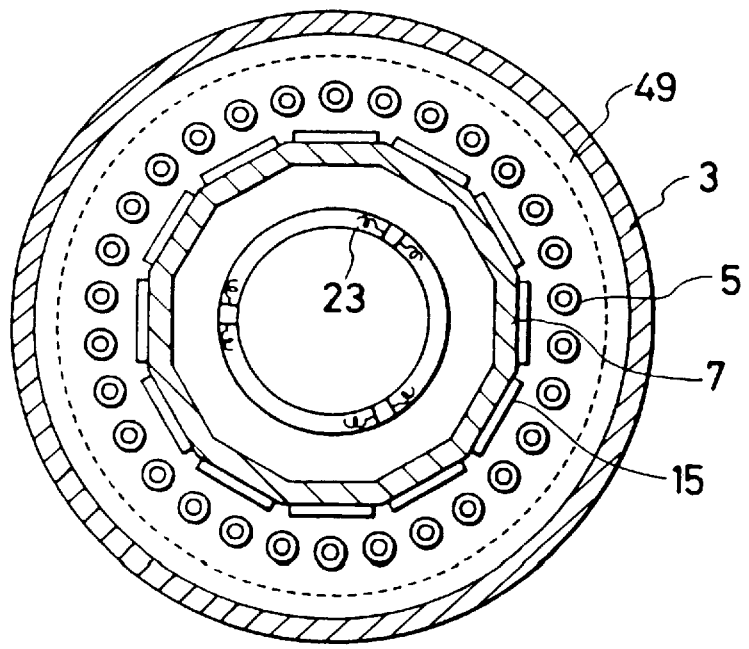
FIG. 4 is a cross-section view showing another embodiment of the invention.

Referring now to FIG. 4, another embodiment of the invention is illustrated. This embodiment is same as the preceding embodiment except for the number of side faces of a cart and provision of an electrode 49 in the form of a cylindrical wire net disposed between the cart 7 and the reaction chamber 3. The cart has twelve side faces each capable of holding two substrates. The electrode 49 is used both for generating plasma gas by discharging between itself and the cart 7, and for carrying our etching eliminating unnecessary product deposited on the inside wall of the reaction chamber 3, the external surfaces of the light sources 5 and so forth. The electrode 49 can be placed between the light sources 5 and the cart 7 instead. Plasma CVD may be implemented simultaneously by causing discharge during photo CVD process, or may be implemented after deposition by photo CVD. Plasma CVD is carried out, e.g., using TEOS (tetra-ethyl-oxy-silane) in accordance with the following equations:

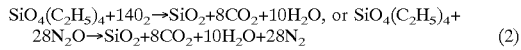
$$SiO_4(C_2H_5)_4+14O_2 \rightarrow SiO_2+8CO_2+10H_2O, \text{ or } SiO_4(C_2H_5)_4+$$
$$28N_2O \rightarrow SiO_2+8CO_2+10H_2O+28N_2 \quad (2)$$

After taking out, from the reaction chamber, the substrates on which the deposition has been deposited, undesirable deposited product is removed from the inside of the reaction chamber by means of etching in virtue of discharge between the cart 7 and the electrode 49. The etching is carried out, e.g., in accordance with the following equations:

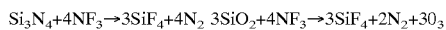
$$Si_3N_4+4NF_3 \rightarrow 3SiF_4+4N_2 \quad 3SiO_2+4NF_3 \rightarrow 3SiF_4+2N_2+3O_3$$

Figure 5A:
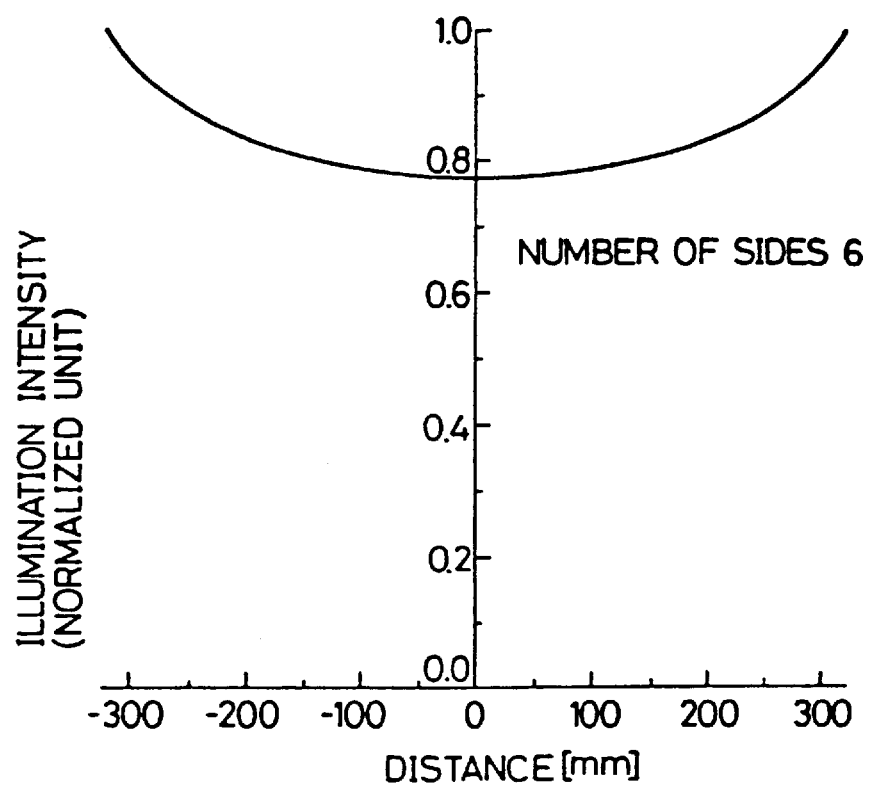
FIGS. 5(A), 5(B) and 5(C) are graphical diagrams showing the distributions of the intensity on substrates mounted on prism-shaped substrate holder having cross-sections of regular polygons of 6, 12, and 24 sides.
Figure 5B:
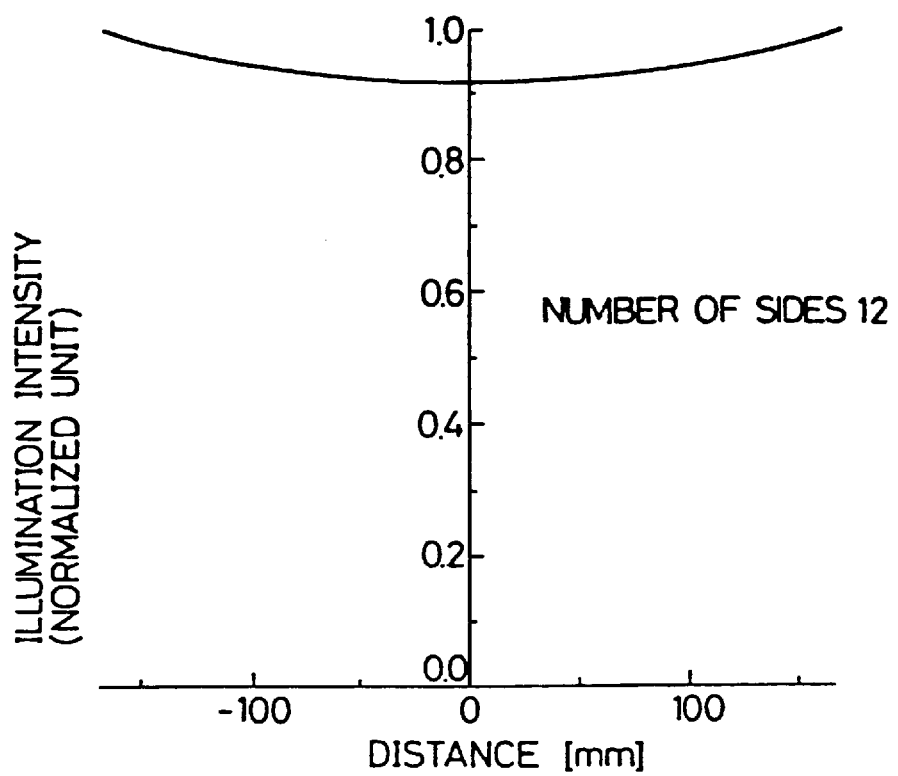
Figure 5C:
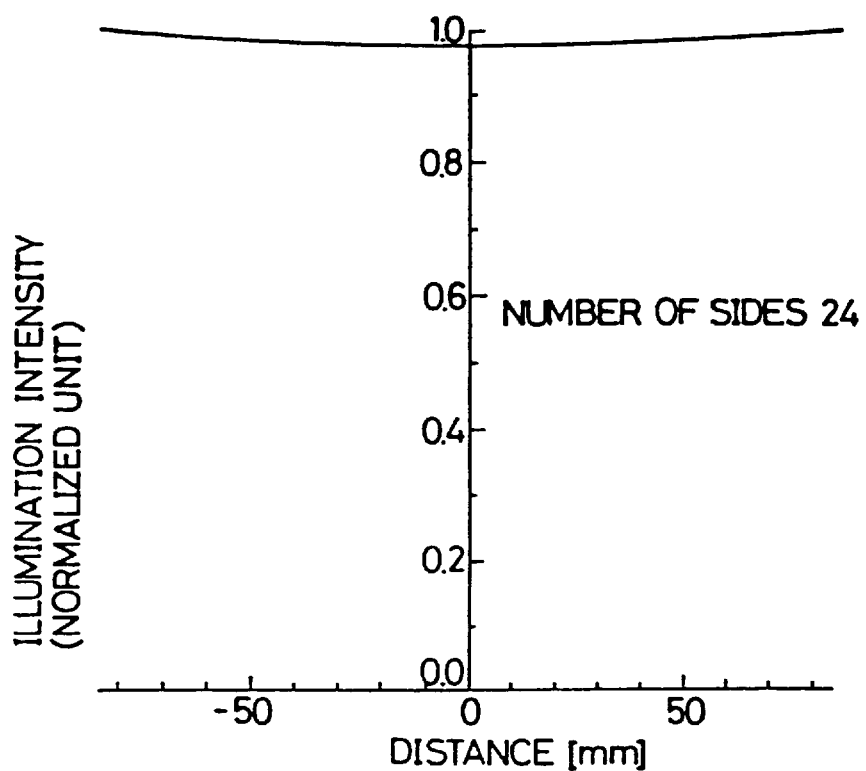

To investigate the relationship between the uniformity of the illumination intensity on the substrate and the number of side faces of the cart, experimental data has been gathered. FIGS. 5(A) to 5(C) are graphical diagrams showing the distributions of the intensity on substrates mounted on prism-shaped substrate holders having cross-sections of regular polygons of 6, 12 and 24 sides. In the figure, the abscissa is the distance of the measuring point from the center of a substrate, and the ordinate is the intensity normalized with reference to the maximum intensity measured on the substrate. As shown from the diagrams, the distribution of the intensity becomes more uniform as the number of the faces increases. Namely, the intensity fluctuates over the irradiated surface at larger than 10% in the case of the cart having six faces, while the fluctuation of the intensity is limited within 5% in the cases of the carts having twelve and twenty-four faces. The cart having twenty-four faces may hold forty-eight substrate by mounting two substrates on each face.

Figure 6A:
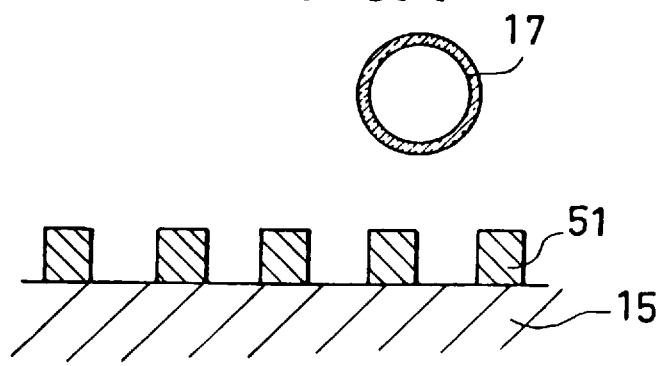
FIGS. 6(A), 6(B) and 6(C) and FIG. 7 are section views showing the process of an example of CVD in accordance with this invention.
Figure 6B:
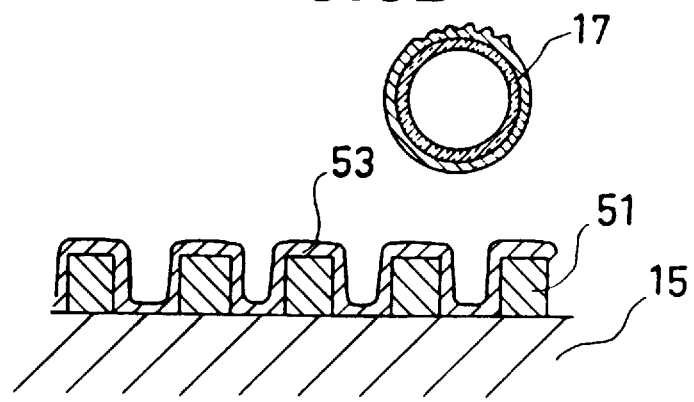
Figure 6C:
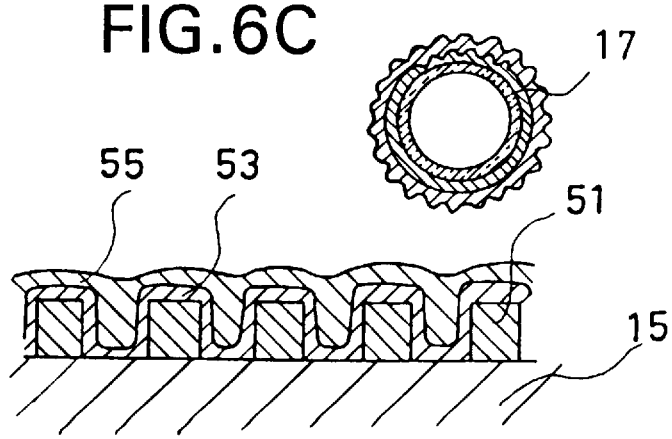

FIGS. 6(A), 6(B) and 6(C) are cross-section views showing an example of CVD process in accordance with the present invention. The surface of a substrate to be coated is provided with a plurality of aluminum lead lines 51. The leads 51 are elongated in the direction perpendicular to the drawing sheet with 0.8 micron in height, 0.6 micron in width and 0.9 micron in interval as shown in FIG. 6(A). A silicon oxide film is deposited on the substrate over the leads 51 by photo CVD in accordance with the equation (1) to the thickness of 0.3 to 0.5 at about 400° C. as shown in FIG. 6(B). Further, another silicon oxide film 55 is deposited by plasma CVD in accordance with the equation (2) at 200° C. as shown in FIG. 6(C).

Figure 7:
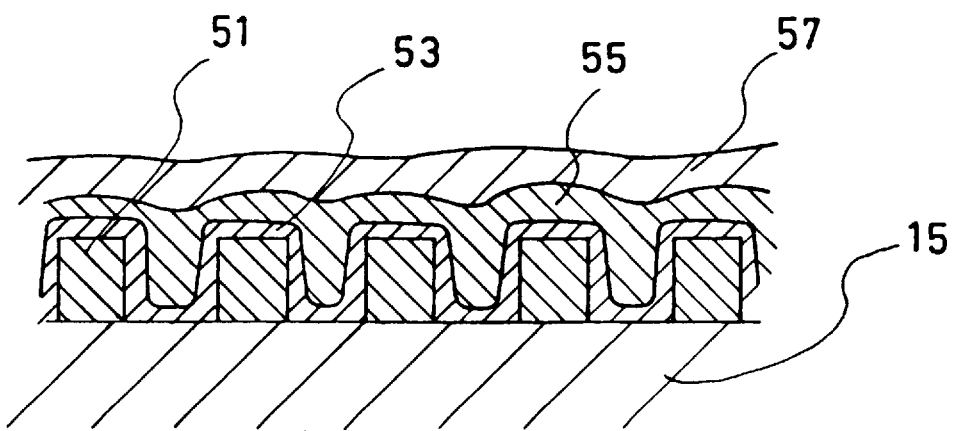

The use of TEOS is advantageous particularly for forming a film on an uneven surface, specifically, it is possible to form a substantially even or uniform film, even on a side surface of or on a lower surface between the steps shown in FIG. 6(A) by reference numeral 51. It is presumed that this is because TEOS is in a liquid state at room temperature and has a relatively large viscosity even when it is gasified. The even upper surface is desirable when provided with an overlying aluminum electrode 57 as shown in FIG. 7. The likelihood of disconnection of electrode 57 is reduced by the even surface. After the completion of the deposition, the inside of the reaction chamber on the mercury lamp 19, only one being schematically shown in FIGS. 6(A), 6(B) and 6(C). The etching process can be implemented on the deposited film before or after plasma CVD in order to obtain even surface of the film or to chamfer the edge of the film deposited.

By use of this process, film is deposited with a constant thickness throughout the surface of the substrate 15 in the light of the uniform irradiation over each substrate. However, the uniformity of the thickness can be further improved by modulating the intensity of the mercury lamps 19 in synchronization with the rotation of the cart 7, or by modulating the angular speed of the cart 7 in correspondence with the relative position to the mercury lamps 19. According to the gist of the invention, it is easily understood that the performance of non-photo enhanced plasma CVD is also improved by the use of the rotatable substrate holder.

The invention should not limited to the above particular embodiments and modifications and variations are possible as would be recognized by those skilled in the art. As the cross-section of the cart 7, other regular or irregular polygons, or circle can be employed. Also the driving device can be provided on the top side of the reaction chamber, or on the lateral side with pinion gear, in place of the bottom side as shown in FIG. 2.

We claim:

1. A method for forming a film on a substrate comprising the steps of:

preparing a substrate having an uneven upper surface in a reaction chamber;

forming a layer comprising silicon oxide on said uneven upper surface by plasma CVD using a reactive gas comprising at least organic silane and nitrogen oxide in said reaction chamber; and cleaning an inside of said reaction chamber by plasma cleaning.

2. The method of claim 1 further comprising the step of removing an upper portion of said layer.

3. The method of claim 1 wherein said organic silane is TEOS.

4. The method of claim 1 wherein said nitrogen oxide is $N_2O$.

5. A method for forming a film comprising the steps of:

preparing a substrate having an uneven upper surface provided with aluminum leads thereon;

forming a layer comprising silicon oxide on said uneven upper surface by plasma CVD using a reactive gas comprising at least organic silane and nitrogen oxide.

6. The method of claim 5 further comprising the step of removing an upper portion of said layer.

7. The method of claim 5 wherein said organic silane is TEOS.

8. The method of claim 5 wherein said nitrogen oxide is $N_2O$.

9. A method of forming a film comprising the steps of:

preparing a substrate having an uneven surface;

forming a first layer comprising a material selected from the group consisting of silicon oxide and silicon nitride by CVD;

forming a second layer comprising silicon oxide by plasma CVD using a reactive gas containing at least organic silane and nitrogen oxide.

10. The method of claim 9 wherein said organic silane is TEOS.

11. The method of claim 9 wherein said nitrogen oxide is $N_2O$.

12. The method of claim 9 wherein said first layer is formed by using a reactive gas comprising $SiH_4$ or $Si_2H_6$.

13. A method for forming a device comprising the steps of:

preparing a substrate having an uneven upper surface;

forming a first layer comprising a material selected from the group consisting of silicon oxide and silicon nitride on said uneven upper surface by CVD using a first reactive gas comprising a carbon free silicon containing material; and forming a second layer comprising silicon oxide on said first layer by plasma CVD using a second reactive gas comprising at least organic silane.

14. The method of claim 13 wherein said carbon free silicon containing material is selected from the group consisting of $SiH_4$ and $Si_2H_6$.

15. The method of claim 13 wherein said organic silane is TEOS.

16. A method for forming a device comprising the steps of:

preparing a substrate having an uneven upper surface provided with aluminum leads thereon;

forming a first layer comprising a material selected from the group consisting of silicon oxide and silicon nitride on said uneven upper surface by CVD using a first reactive gas comprising a carbon free silicon containing material; and forming a second layer comprising silicon oxide on said first layer by plasma CVD using a second reactive gas comprising at least organic silane.

17. The method of claim 16 further comprising the step of etching a surface of said second layer.

18. The method of claim 16 wherein said carbon free silicon containing material is selected from the group consisting of $SiH_4$ and $Si_2H_6$.

19. The method of claim 16 wherein said organic silane is TEOS.

20. A method for forming a device comprising the steps of:

preparing a substrate having an uneven upper surface provided with a first lead comprising aluminum;

forming a first layer comprising a material selected from the group consisting of silicon oxide and silicon nitride on said uneven upper surface by CVD using a carbon free silicon compound gas;

forming a second layer comprising silicon oxide on said first layer by plasma CVD using a reactive gas containing at least organic silane;

removing an upper portion of said second layer to obtain a smoother surface; and then forming a second lead comprising aluminum on said second layer.

21. The method of claim 20 wherein said reactive gas further contains nitrogen oxide.

22. The method of claim 20 wherein said carbon free silicon containing material is selected from the group consisting of $SiH_4$ and $Si_2H_6$.

23. The method of claim 20 wherein said organic silane is TEOS.

* * * * *

UNITED STATES PATENT AND TRADEMARK OFFICE
CERTIFICATE OF CORRECTION

PATENT NO.    :   5,855,970
DATED         :   January 5, 1999
INVENTOR(S)   :   Takashi Inushima et al.

It is certified that error appears in the above-identified patent and that said Letters Patent is hereby corrected as shown below:

On title page, item [30] should read as follows:
[30]    Foreign Application Priority Data Sep. 9, 1986    [JP]    Japan ....................61-213323
    Sep. 9, 1986    [JP]    Japan ....................61-213324
    Sep. 9, 1986    [JP]    Japan ....................61-213325
    June 5, 1987    [JP]    Japan ....................62-141050

Signed and Sealed this

Seventh Day of September, 1999

Attest:

Q. TODD DICKINSON

*Attesting Officer*    *Acting Commissioner of Patents and Trademarks*